(12) United States Patent
Rengachari

(10) Patent No.: US 7,750,628 B2
(45) Date of Patent: Jul. 6, 2010

(54) MAGNETIC FIELD SENSOR CIRCUIT WITH COMMON-MODE VOLTAGE NULLING

(75) Inventor: Thirumalai Rengachari, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 614 days.

(21) Appl. No.: 11/772,133

(22) Filed: Jun. 30, 2007

(65) Prior Publication Data

US 2009/0001981 A1 Jan. 1, 2009

(51) Int. Cl.
*G01R 33/02* (2006.01)
(52) U.S. Cl. .................................. 324/252; 324/207.2
(58) Field of Classification Search .............. 324/207.2, 324/252
See application file for complete search history.

(56) References Cited

U.S. PATENT DOCUMENTS

| 6,362,618 | B1 | 3/2002 | Motz |
| 2006/0164073 | A1 | 7/2006 | Bergsma |

OTHER PUBLICATIONS

Kayal, et al., "Automatic Calbration of Hall Sensor Microsystems", Microelectronics Journal, 2006, pp. 1569-1575, vol. 3, Elsevier, Amsterdamn, Netherlands.

Demierre, et al., "Improvements of CMOS Hall Microsystems and Application for Absolute Angular Position Measurements", Ecole Polytechnique Federale de Lausanne, Sep. 2003, Switzerland.
Sentron AG, Datasheet for CSA-1V, Aug. 2004, Switzerland.
Pastre, et al., "A Hall Sensor Analog Front End for Current Measurement wiht Continous Gain Calibration", IEEE International Solid-State Circuits Conference 2005 Digest of Papers, IEEE Press, pp. 242-243.
Travis, "Hall Effect Sensors Sport Magnetic Personalities", EDN, Apr. 1998.

*Primary Examiner*—Reena Aurora
(74) *Attorney, Agent, or Firm*—Andrew M. Harris; Mitch Harris, Atty at Law, LLC

(57) ABSTRACT

A magnetic field sensor circuit with common-mode voltage nulling, reduces or eliminates the effect of common-mode variation and transients due to rotation of the magnetic field sensor terminals between the bias current source and sensor output voltage terminals. A switching circuit rotates the bias current source and sensor output voltage terminals between pairs of terminals of the semiconductor magnetic field sensor. After each rotation, the switching circuit momentarily shorts all of the terminals of the semiconductor magnetic field sensor to a reference voltage such as ground. After a predetermined period of time, a sample/hold circuit having an input coupled to the sensor output terminals samples and holds the voltage at the sensor output voltage terminals, resulting in a sampled output free of common mode error between samples due to common-mode error and magnitude changes between magnetic field sensor terminal pairs.

20 Claims, 2 Drawing Sheets

MAGNETIC FIELD SENSOR CIRCUIT WITH COMMON-MODE VOLTAGE NULLING

BACKGROUND OF THE INVENTION

1. Field of the Invention

The present invention relates generally to magnetic field sensors, and more specifically, to a circuit that nulls common-mode voltage variation for a rotating terminal magnetic field sensor.

2. Background of the Invention

Hall effect sensors and other semiconductor magnetic field sensors are widely used in applications in which it is desirable to provide a measurement of DC magnetic fields and relatively low frequency AC magnetic fields that are not otherwise easily sensed with coils or other antennas. Such applications include position and motion sensors for both linear and rotational motion, power supply and motor control applications in which the transformer or motor fields are detected, audio speaker applications in which the strength of the speaker's signal-induced field is detected, and lighting controllers for high-frequency energized lamps, such as sodium lamps.

Hall effect sensors operate by providing a layer of semiconductor material with a bias current applied across one axis and sensing a voltage across the other axis. When a magnetic field is present, the uniformity of the current in the layer of material is distorted, causing non-uniform voltage distribution along the material and a differential voltage to appear across a pair of sensing terminals. To improve performance, the terminals receiving the bias current can be rotated by interchanging them with the terminals used to sense the output voltage by using a switching network, effectively "rotating" the position of the sensor terminals. The resulting output signal is modulated to a higher carrier frequency, which can be used to eliminate the effect of low frequency flicker noise in the sensing amplifier circuit and average out variations in the semiconductor material. The number of terminals can be increased from four to any number to further reduce the impact of material characteristic variations.

More recently, sensor implementations have been proposed that impose an AC magnetic field on the sensor using a current loop, which can then be detected at the sensor output and used to calibrate the sensor circuit. One or more current loops is implemented around the sensor and stimulated with a signal having known characteristics, inducing an AC magnetic field at the sensor, which causes an AC voltage of the same frequency profile in the sensor output voltage. The sensor output can then be detected and the gain of the sensor circuit adjusted to calibrate the sensor. Such circuits still use a static bias current to generate a voltage gradient that is distorted by the magnetic field to generate the sensor output voltage variation, and the bias current terminals and voltage sensing terminals can also be rotated as described above.

However, rotation of the sensor voltage causes artifacts that can disrupt the operation of the amplifier used to amplify the output voltage signal. Since the sensor material has non-uniformity, the terminal pairs have some capacitance, and since DC electric fields present at the sensor will also cause a static voltage difference between the output terminal sets that are being rotated, the effective common-mode voltage across each terminal pair can deviate substantially. When the terminal pairs are switched, the differences in common-mode voltage cause a transient at the output of the sensing amplifier, which for high rotation frequencies can become a substantial portion of the interval between rotations during which the signal is measured. Further, for low bandwidth detection applications, the settling time for the transient error to pass can be substantial. Since the transient error is multiplied by the common-mode rejection ratio of the sensing circuit for all of the frequencies of the transient, in some applications, the presence of the transient is intolerable.

Also, the rotation of the sensor voltage causes differential transients in the input circuit, as the non-uniformities in the material and external fields as described above will shift not only the common-mode voltages, but the magnitudes of the detected output voltage. Differences between the terminal capacitances, output resistance and switch resistance and the above-described static potential differences will cause differential transients in addition to any common-mode transients, when the terminals are rotated.

Therefore, it would be desirable to provide a semiconductor magnetic field sensor measurement circuit having a rotated bias and output voltage terminal connection to the sensor, in which the effects of the common-mode voltage at the sensor terminal pairs is reduced or eliminated and in which common-mode and differential transient changes in the output voltage are prevented from disrupting measurements.

SUMMARY OF THE INVENTION

The above stated objective of providing a semiconductor magnetic field sensor measurement circuit having a rotated bias and output voltage terminal, in which differential and common-mode transients are prevented from disrupting operation is accomplished in a circuit and method. The method is a method of operation of the circuit.

The circuit is a magnetic field sensor sampling circuit that includes a switching network for rotating the sensor output voltage and bias current terminals between terminal pairs of the magnetic field sensor. After each rotation, the switching circuit momentarily shorts the terminals of the magnetic field sensor to a reference voltage, such as ground to reset the common mode voltage. The sensor output voltage terminals from the switching network are applied to a sample/hold circuit, and the hold signal is asserted a predetermined time after the momentary shorting action is ceased. The result is a sample/hold output referenced to a single common-mode voltage that contains little or no common-mode error due to the sensor. The shorting action also reduces output terminal residual error voltages due to transients generated by switching between sets of sensor terminals during rotation.

The sample/hold amplifier may be followed by a chopper amplifier that is switched at the same frequency as the rotation and sampling rate.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses a semiconductor magnetic field sensor circuit and method that employs a sample/hold circuit and a terminal shorting switching circuit to remove the effects of common-mode offsets and differential magnitudes between rotation positions at the outputs of the magnetic field sensor, effectively nulling the common-mode offsets. The resulting operation forces the common mode voltage of the sensor output to a fixed value, and prevent the offset and magnitude differences from causing circuit-disrupting transients when the position of the sensor terminals is rotated according to a periodic switching signal.

Figure 1:
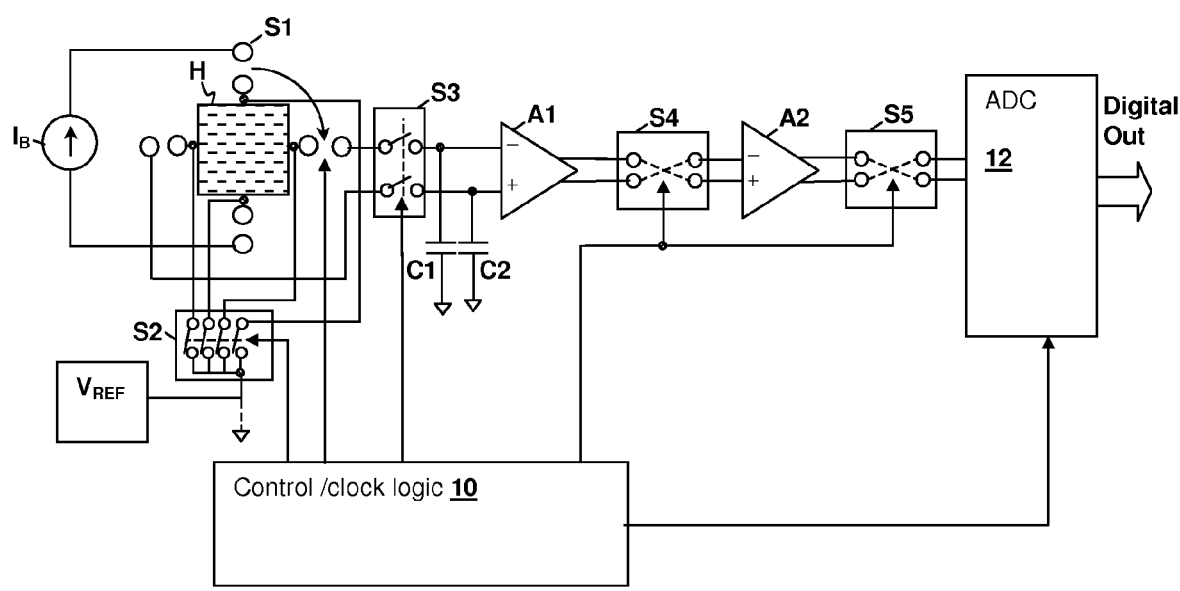
FIG. 1 is a block diagram depicting an exemplary magnetic field sensor circuit in accordance with an embodiment of the present invention.

Referring now to FIG. 1, an exemplary semiconductor magnetic field sensor circuit in accordance with an embodiment of the present invention is shown. A Hall effect sensor H, which may alternatively be another type of magnetic field sensor such as a magneto-resistive device, is provided a bias current from a bias current source $I_B$, and has output terminals connected to differential inputs of amplifier A1 via a sample/hold switch S3. A rotation switch S1 provides for rotation of each of the terminals of Hall effect sensor H, so that each terminal, in turn, serves as the positive and negative bias current and output voltage terminals, depending on a rotation phase controlled by control/clock logic 10.

A shorting switch S2 has a switching element for each of the terminals of Hall effect sensor H, and after each rotation, control/clock logic 10 activates all of the elements of switch S2 to short each of the terminals of Hall effect sensor H to ground, or to another common-mode voltage reference such as voltage reference $V_{REF}$. Amplifier A1 has a differential pair of input terminals that are connected to a pair of hold capacitors C1 and C2. When switch S3 is open, amplifier A1 holds the voltage that was sampled when switch S3 was last closed. Control/clock logic 10 operates switch S3 such that switch S3 is opened prior to the rotation that occurs when rotation switch S1 is changed, left open while shorting switch S2 momentarily shorts the terminals of Hall effect sensor H and then returns amplifier A1 to the sample state a predetermined time after the shorting is complete and the new rotation is applied. The above-described operation results in a rotated measurement that is guaranteed to start at the same common mode voltage, and in which the transients that would otherwise be introduced to amplifier A1 from differences in the terminal voltages of Hall effect sensor H, both common-mode and differential, are prevented.

Switches S4, S5 and amplifier A2 provide a chopper amplifier that chops (modulates) the output of amplifier A1 to further reduce 1/f flicker noise and DC offset that might otherwise affect the measurement values provided to analog-to-digital converter (ADC) 12, which is generally a delta-sigma modulator ADC, but may be another type of ADC, to yield a digital output representation Digital Out of the magnetic field strength detected by Hall effect sensor H.

Figure 2:
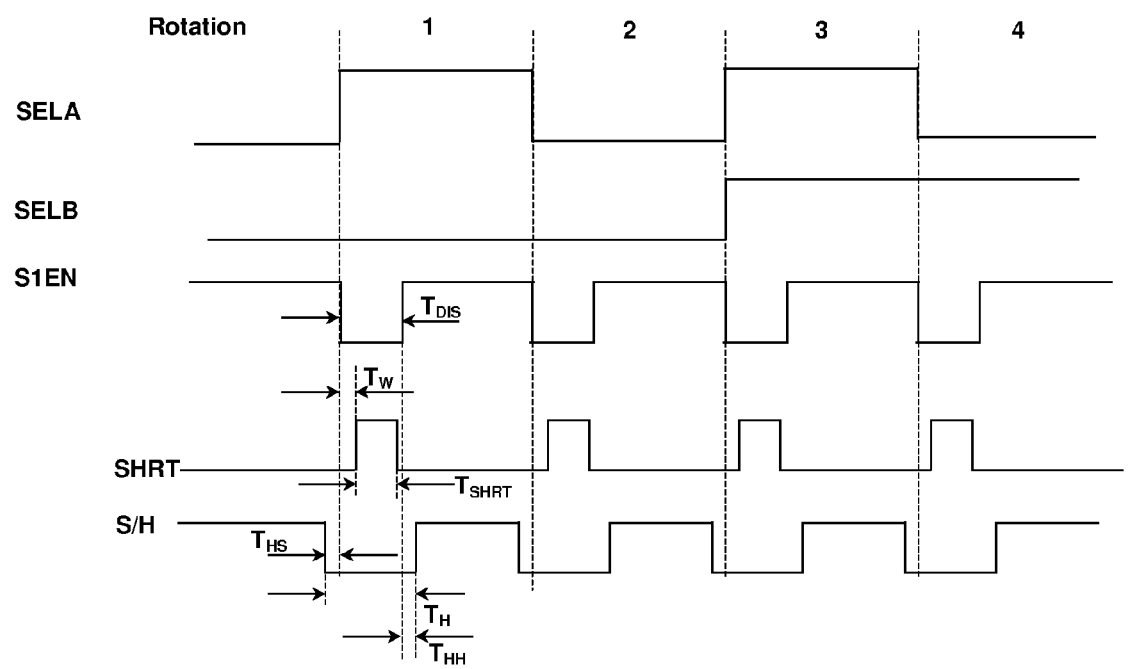
FIG. 2 is a timing diagram depicting switching signals and phases of operation of the magnetic field sensor circuit of FIG. 1.

Referring now to FIG. 2, the timing of signals within the circuit of FIG. 1 are illustrated. The Rotation cycle (1-4) corresponds to the positions of switch S1, which is controlled by selection signals SELA, SELB and an enable signal S1EN, according to the following table:

where H1-H4 are the four terminals of Hall effect sensor H. H1, H3 are opposing terminals and H2, H4 are the other set of opposing terminals. S1 (TOP, RIGHT, BOTTOM and LEFT) are the elements of switch S1 in the positions shown in FIG. 1. Thus signals SELB and SELA encode a selection that selects on of four rotations that select pairs of opposing terminals of Hall effect sensor H for application to the bias current source $I_B$ and the orthogonal pair of terminals to the input of sample-hold amplifier A1, and also rotate the polarity of the terminals so applied.

Signal SHRT is the signal provided from clock/control logic 10 that activates switch S2. As illustrated, a predetermined time $T_W$ after the last rotation phase has ended, signal SHRT is asserted to close the elements of switch S2. The shorting action of switch S2 is maintained for another predetermined period $T_{SHRT}$, while signal S1EN disables all of the elements of switch S1 for period $T_{DIS}$. A predetermined period $T_{HS}$ prior to disabling the elements of switch S1, the S/H signal is de-asserted to hold the value sampled during the previous rotation and that value is held for period $T_H$ until another predetermined period $T_{HH}$ after the shorting action is complete and switch S1 is enabled in the new rotation by the assertion of signal S1EN. It is understood that while hold period $T_H$ is shown as being a substantial portion of a rotation cycle for clarity, that the actual hold period $T_H$ may be very short compared to the sample time, so that the amount of settling time for amplifier A1 and signal handling circuits further along the signal path is increased.

While the invention has been particularly shown and described with reference to the preferred embodiments thereof, it will be understood by those skilled in the art that the foregoing and other changes in form and details may be made therein without departing from the spirit and scope of the invention.

What is claimed:

1. A circuit for providing an output signal generated in conformity with an output of a semiconductor magnetic field sensor, the circuit comprising:
    a bias current source for providing a bias current to the semiconductor magnetic field sensor;
    a switching circuit for rotating at least one first terminal and at least one second terminal between at least one output of the bias current source and at least one sensor output voltage terminal according to a first clock signal;
    a sample-hold circuit having an input coupled to the at least one sensor output voltage terminal, and wherein the sample-hold circuit is controlled by a second clock signal such that the sample-hold circuit samples a voltage at the at least one sensor output voltage terminal at a predetermined time after transitions of the first clock signal, whereby artifacts generated by operation of the switching circuit are not present at an output of the sample-hold circuit.

TABLE 1

| Rotation | S1EN | SELB | SELA | S1 (TOP) | S1 (RIGHT) | S1 (BOTTOM) | S1 (LEFT) |
|---|---|---|---|---|---|---|---|
| between rotation | 0 | d | d | open | open | open | open |
| 1 | 1 | 0 | 0 | H1 | H2 | H3 | H4 |
| 2 | 1 | 0 | 1 | H4 | H1 | H2 | H3 |
| 3 | 1 | 1 | 0 | H3 | H4 | H1 | H2 |
| 4 | 1 | 1 | 1 | H2 | H3 | H4 | H1 |

2. The circuit of claim 1, further comprising a chopper amplifier having an input coupled to an output of the sample-hold circuit, wherein the chopper amplifier is operated at a frequency equal to a frequency of the first clock signal.

3. The circuit of claim 1, wherein the at least one first terminal comprises a first pair of terminals, wherein the at least one second terminal comprises a second pair of terminals, and wherein the switching circuit rotates the first pair of terminals and the second pair of terminals between a pair of differential input terminals of the sample-hold circuit and a pair of terminals of the bias current source that provide the bias current.

4. The circuit of claim 3, further comprising a second switching circuit for shorting each of the first pair of terminals and each of the second pair of terminals to a reference voltage for a predetermined time period after the transitions of the first clock signal, whereby a common mode voltage of the semiconductor magnetic field sensor is set to the reference voltage.

5. The circuit of claim 4, wherein the reference voltage is ground.

6. The circuit of claim 4, wherein the reference voltage is provided from a common-mode voltage reference circuit.

7. The circuit of claim 4, wherein the second switching circuit shorts each of the first pair of terminals and each of the second pair of terminals starting at a first predetermined time after a transition of the first clock signal and ending at a second predetermined time, wherein the first and second predetermined times are prior to the predetermined time that the second clock signal causes the sample-hold circuit to sample the voltage of the at least one sensor output terminal.

8. A circuit for providing an output signal generated in conformity with an output of a semiconductor magnetic field sensor, the circuit comprising:
a bias current source for providing a bias current to the semiconductor magnetic field sensor;
a switching circuit for rotating at least one first terminal and at least one second terminal between at least one output of the bias current source and at least one sensor output voltage terminal according to a first clock signal; and
a shorting circuit for shorting the at least one first terminal and the at least one second terminal to a reference terminal, whereby a common mode voltage of the semiconductor magnetic field sensor is set to the reference voltage.

9. The circuit of claim 8, wherein the reference terminal is connected to ground.

10. The circuit of claim 8, further comprising a voltage reference circuit for providing a common-mode voltage reference, and wherein the reference terminal is connected to an output of the voltage reference circuit.

11. The circuit of claim 8, wherein the at least one first terminal comprises a first pair of terminals, wherein the at least one second terminal comprises a second pair of terminals, and wherein the switching circuit rotates the first pair of terminals and the second pair of terminals between a pair of differential input terminals of the sample-hold circuit and a pair of terminals of the bias current source that provide the bias current.

12. The circuit of claim 11, wherein the shorting circuit shorts each of the first pair of terminals and each of the second pair of terminals to a reference voltage for a predetermined time period after the transitions of the first clock signal, whereby a common mode voltage of the semiconductor magnetic field sensor is set to the reference voltage.

13. The circuit of claim 12, wherein the reference terminal is connected to ground.

14. The circuit of claim 12, further comprising a voltage reference circuit for providing a common-mode voltage reference, and wherein the reference terminal is connected to an output of the voltage reference circuit.

15. The circuit of claim 12, further comprising a clock logic for controlling the switching circuit and the shorting circuit, wherein the shorting circuit is operated only for a predetermined time period starting after the switching circuit rotates the at least one first terminal and the at least one second terminal.

16. A method of measuring an output of a semiconductor magnetic field sensor, comprising:
rotating a bias current and at least one output terminal between terminals of the semiconductor magnetic field sensor;
momentarily shorting the at least one output terminal to a reference voltage terminal, whereby a common-mode variation in a voltage of the at least one output terminal with respect to positions of the rotating is reduced.

17. The method of claim 16, wherein the momentarily shorting shorts all of the terminals of the semiconductor magnetic field sensor to the reference voltage.

18. The method of claim 16, further comprising:
sampling a voltage of the at least one output terminal at a predetermined time after the completion of the momentary shorting; and
holding a result of the sampling until a next sampling.

19. The method of claim 16, wherein the momentarily shorting grounds the at least one output terminal.

20. The method of claim 16, further comprising generating a common-mode reference voltage, and wherein the momentarily shorting applies the common-mode reference voltage to the at least one output terminal.

* * * * *